United States Patent [19]
Nayebi et al.

[11] Patent Number: 5,389,929
[45] Date of Patent: Feb. 14, 1995

[54] TWO-STEP SUBRANGING ANALOG-TO-DIGITAL CONVERTER

[75] Inventors: Mohammad R. Nayebi, Palo Alto; Alexandru Hartular, San Jose, both of Calif.

[73] Assignee: Raytheon Company, Lexington, Mass.

[21] Appl. No.: 191,403

[22] Filed: Feb. 3, 1994

[51] Int. Cl.[6] .................................................. H03M 1/14
[52] U.S. Cl. ........................................ 341/156; 341/163; 341/122
[58] Field of Search ......... 341/122, 156, 163, 123–125

[56] References Cited

U.S. PATENT DOCUMENTS

| | | | |
|---|---|---|---|
| 4,124,844 | 11/1978 | Black et al. | 340/347 AD |
| 4,875,048 | 10/1989 | Shimizu et al. | 341/156 |
| 4,903,023 | 2/1990 | Evans et al. | 341/120 |
| 4,947,168 | 8/1990 | Myers et al. | 341/120 |
| 5,043,732 | 8/1991 | Robertson et al. | 341/156 |
| 5,070,332 | 12/1991 | Kaller et al. | 341/156 |
| 5,138,318 | 8/1992 | Matsuzawa | 341/156 |
| 5,283,581 | 2/1994 | Miki et al. | 341/156 |
| 5,313,206 | 5/1994 | Davies et al. | 341/156 |
| 5,345,237 | 9/1994 | Kouno et al. | 341/156 |

*Primary Examiner*—Marc S. Hoff
*Attorney, Agent, or Firm*—William R. Clark

[57] ABSTRACT

A subranging analog-to-digital converter wherein, during a first phase, a differential analog input voltage is held by a track and hold circuit and is fed to a low resolution flash ADC to provide the most significant bits (MSBs). During a second or recirculating phase, flash ADC output segments corresponding to the MSBs are fed to respective current switches of a current DAC to produce complementary analog conversion currents that are coupled to the track and hold circuit. In response to the complementary DAC currents, the output stage of the track and hold circuit is used to subtract a voltage corresponding to the MSBs from the input voltage without the use of a separate subtractor. Further, the DAC current switches provide equal currents during the first or MSB phase to deactivate the subtraction function during the first phase.

12 Claims, 3 Drawing Sheets ized digital output. For example, 4 LSBs are combined with 4 MSBs to provide a digital value having 8-bit resolution.
TWO-STEP SUBRANGING ANALOG-TO-DIGITAL CONVERTER

BACKGROUND OF THE INVENTION

This invention generally relates to analog-to-digital converters, and more particularly relates to two step subranging analog-to-digital converters using recirculation through a single low resolution flash analog-to-digital converter.

As is well known, the function of an analog-to-digital converter (ADC) is to convert an analog input signal $V_i$ into a corresponding digital output represented by a coded array of binary bit signals. One type of ADC typically used for high speed applications is a parallel or flash converter. A flash ADC generally employs $2^n-1$ analog comparators to implement the quantization function of an ADC. In particular, the comparators trip points are spaced one least significant bit (LSB) apart by a series resistor chain and a voltage reference. For a given analog input voltage $V_i$, all comparators biased below the voltage turn on, and those biased above turn off. A decoder is typically used to convert the output of the comparators into binary from.

Although a flash ADC has an advantage in being very fast, the fact that $2^n-1$ comparators are generally required is a disadvantage where relatively high resolution is desired. For example, although only 15 comparators are generally required for a 4-bit converter, 255 comparators are generally required for an 8-bit converter. To overcome this disadvantage, higher resolution ADCs commonly use two or more stages. For example, with an 8-bit converter, the result of a first 4-bit conversion is converted back to analog using a 4-bit digital-to-analog converter (DAC), and then subtracted from the analog input. The resulting residue is then converted by a second flash ADC, and the two sets of data are accumulated in a 8-bit register. By such arrangement, the number of bits can be doubled by merely doubling the number of comparators.

Another prior art technique for further reducing the number of required comparators is described in U.S. Pat. No. 5,070,332. In this arrangement, only one flash ADC is used, and the residue is recirculated back through it. In particular, with reference to prior art FIG. 1, an analog input signal $V_i$ is held at node 10 by track & hold 12. During a first step or phase, the held analog input is fed to m-bit flash ADC 14 through switch 16 which is controlled by timing and control logic 18. Flash ADC 16 is a low resolution converter, and converts the analog signal into the upper or most significant bits (MSBs) of its digital value. The most significant bits are stored in logic 20, and also fed to m-bit DAC 22. DAC 22 reconverts the first step m-bit digital value into an analog value which is fed to subtractor 24 where it is subtracted from the held input analog signal $V_i$. The difference or residue is then coupled to differential amplifier 26 where it is multiplied up to the corresponding level of the MSBs. At the commencement of the second step or phase, switch 16 is switched to feed the multiplied residue to m-bit flash ADC 14 to provide the lower or least significant bits (LSBs). The LSBs of the second step are then combined with the MSBs from the first step in logic 20 to produce a high resolution digital output. For example, 4 LSBs are combined with 4 MSBs to provide a digital value having 8-bit resolution.

SUMMARY OF THE INVENTION

In accordance with the invention, a subranging analog-to-digital converter comprises a flash analog-to-digital converter through which the residue following a first conversion is recirculated. A differential track and hold means has first and second like sections each being responsive to a respective input of a differential analog input voltage. Each section has an output terminal coupled through like first resistors to a voltage source. Further, a second resistor is connected between respective nodes of the first and second sections. The differential track and hold means comprises means responsive to control signals for causing a voltage between the nodes to track the differential analog input voltage during a track mode and for causing the voltage between the nodes to be held during a hold mode wherein the differential analog input voltage is applied across the second resistor.

Current source means draws like currents from the nodes during a first conversion phase to provide the held differential analog input voltage across the output terminals of the track and hold means. Means then couples the differential analog input voltage from the output terminals to the flash analog-to-digital converter during the first phase to provide most significant bits of the held differential analog input voltage. The current source means further comprises means for drawing respective currents from the nodes of the track and hold means in accordance with outputs from the flash analog-to-digital converter during a second phase to provide a difference or residue voltage across the output terminals wherein the difference voltage is the difference between the held differential analog input voltage and an analog conversion corresponding to the most significant bits. The subranging converter further comprises means for multiplying the difference voltage and coupling the multiplied difference voltage to the flash analog-to-digital converter to provide least significant bits. Means are further included for combining the most and least significant bits to provide a higher resolution digital value.

It is preferable that each section of the track and hold means include an output transistor coupled between the respective node and the respective output terminal. In one arrangement, the collector of each output transistor is connected to the output terminal and the emitter is connected to the node.

With such arrangement, the prior art subtractor is essentially eliminated because the subtraction of current is done in the output stage of the track and hold circuit. Further, the current sources and current switches of a current digital-to-analog converter are used in both the first and second phases when the most and least significant bits are produced. In particular, in the first or MSB phase, an equal number of current sources are connect to each node of each track and hold section so the currents are equal. Under this circumstance, the held differential input voltage across the resistor between the first and second sections is also provided at the output terminals. In the second or LSB phase, IDAC current which is the current conversion of the MSBs is drawn from one node, while its complement $\overline{IDAC}$ current is drawn from the other. Under this circumstance, VDAC which is the voltage conversion of the most significant bits is subtracted from the input voltage at the output terminals of the track and hold. This difference voltage is then multiplied up to the level of the MSBs, and coupled to the flash analog-to-digital converter to provide the least significant bits. The least significant bits are then combined with the most significant bits to provide a digital value having higher resolution than the flash ADC.

BRIEF DESCRIPTION OF THE DRAWINGS

The foregoing objects and advantages will be more fully understood by reading the Description of the Preferred Embodiment with reference to the drawings wherein.

DESCRIPTION OF THE PREFERRED EMBODIMENT

Figure 1:
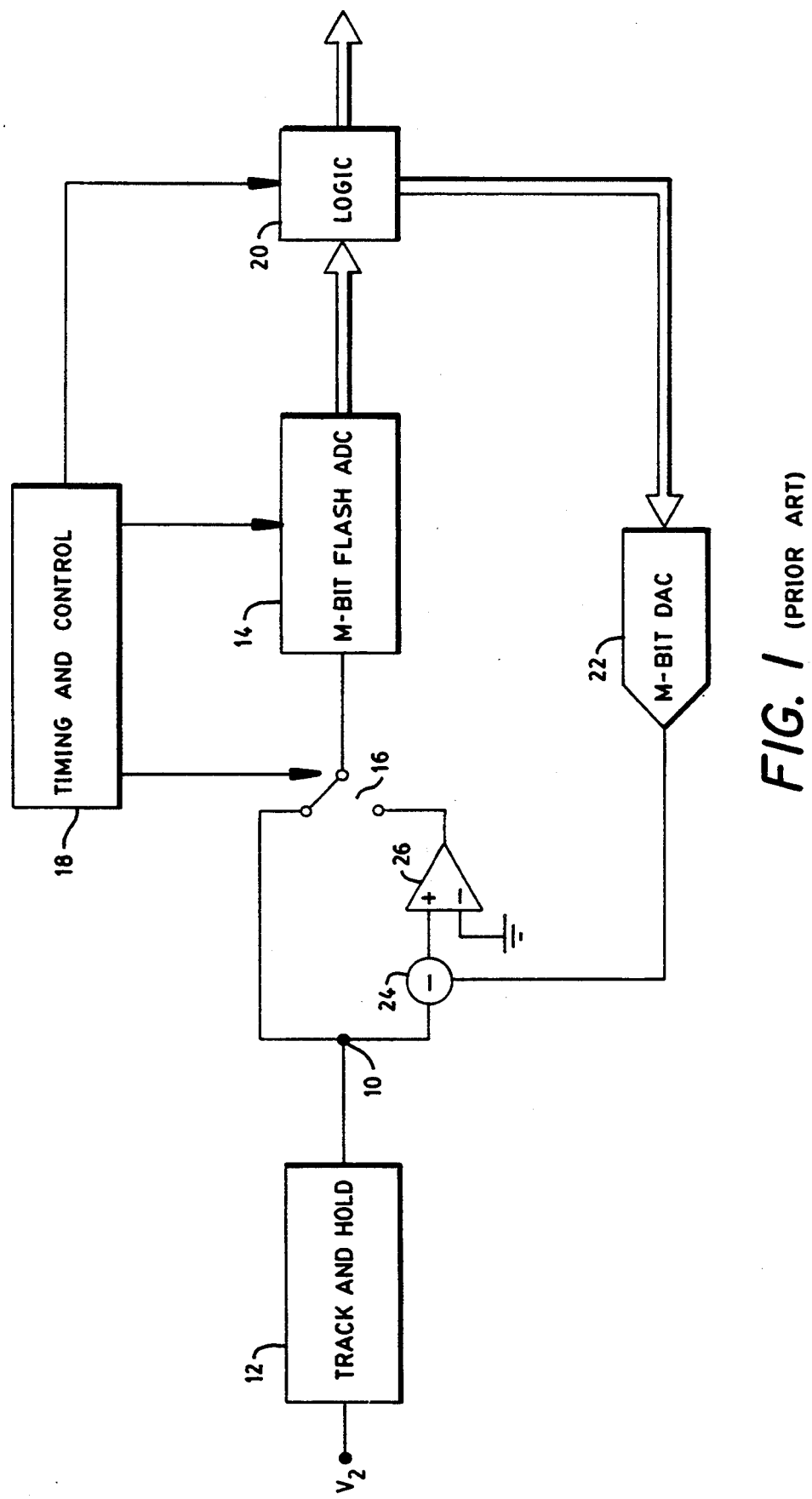
FIG. 1 is a prior art subranging analog-to-digital converter with recirculation through a flash analog-to-digital converter.
Figure 2:
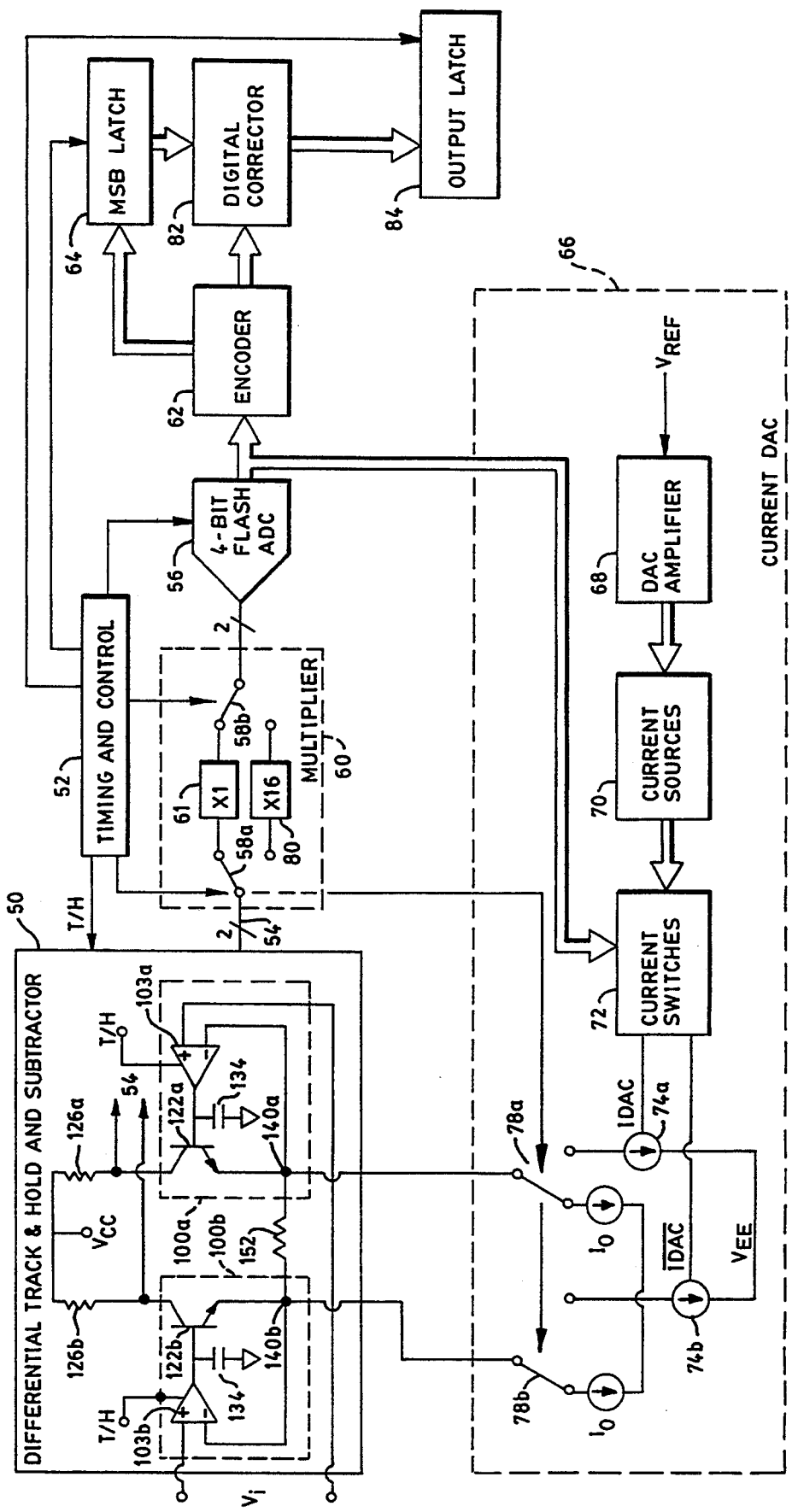
FIG. 2 is a simplified block diagram of an analog-to-digital converter in accordance with the invention.

Referring to FIG. 2, a differential analog signal $V_i$ is fed to the input of differential track & hold and subtractor 50. Under the control of a track/hold (T/H) signal from timing and control 52, differential track & hold and subtractor 50 operates in either a track or hold mode. Differential track & hold and subtractor 50 has two identical sections 100a and b, each of which is responsive to a respective input of the differential analog input voltage $V_i$. Each section 100a and b has a respective operational amplifier 103a and b which has its positive input connected to one of the inputs of $V_i$ as shown. The output of each amplifier 103a and b is connected to a charging capacitor 134 to ground, and also to an output transistor 122a and b. The emitters of output transistors 122a and b are connected to respective nodes 140a and b which are coupled back to the respective negative inputs of amplifiers 103a and b. In response to track signals from timing and control 52, the input to operational amplifiers 103a and b are equalized, so respective nodes 140a and b are caused to track the respective inputs of the differential analog input voltage $V_i$. A resistor 152 is connected between respective nodes 140a and b, so $V_i$ is applied across resistor 152, and input current $I_i$ equal to $V_i$ divided by the resistance of resistor 152 flows through resistor 152. In response to hold signals from timing and control 52, operational amplifiers 103a and b are deactivated, and the respective voltages at nodes 140a and b are held for two steps or phases of analog-to-digital conversion which include first determining the most significant bits (MSBs), and then determining the least significant bits (LSBs) in a recirculation phase.

During the first or MSB phase, switches 78a and b are in the respective positions shown in FIG. 2, so equal currents $I_o$ are drawn from respective nodes 140a and b. The collectors of transistors 122a and b are connected to output nodes 54, which are connected through respective equal resistors 126a and b to a suitable voltage source $V_{cc}$. In a manner to be described in detail with reference to FIG. 3, the differential analog input voltage $V_i$ held across resistor 152 also appears across or between output nodes 54 when currents $I_o$ are equal. Stated differently, there is no subtraction from $V_i$ when the drawn currents are equal, so $V_i$ is presented at the output terminals 54 of differential track & hold and subtractor 50 during the first or MSB phase of conversion. During the first phase, timing and control 52 causes switches 58a and b of multiplier 60 to be in the positions shown in FIG. 2, so the differential output 54, here $V_i$, is coupled through ×1 multiplier 61 to low resolution 4-bit flash ADC 56. The number of comparators (not shown) and corresponding resistors in flash ADC 56 is a function of the resolution desired. Here, flash ADC 56 is shown to be a 4-bit converter, so under the conventional $2^n - 1$ exponential relationship, at least 15 comparators and corresponding resistors are used to provide 15 output segments in conventional manner. As overlap may be desirable for a second recirculating pass through flash ADC 56, more comparators and corresponding resistors may preferably be used. The flash ADC 56 is controlled by timing and control 52, and feeds its digital output to a conventional encoder 62 that provides the most significant bits (MSB), here four, to MSB latch 64 which is also controlled by timing and control 52.

The digital output, here 15 segments, of flash ADC 56 is also coupled to current digital-to-analog converter (DAC) 66. In particular, a reference voltage is fed to DAC amplifier 68 which is coupled to current sources 70 which feed current switches 72. The current switches 72 are responsive to the digital output from flash ADC 56 to produce IDAC and $\overline{IDAC}$ currents 74a and b in conventional manner. As is conventional, IDAC 74a is a direct analog conversion of the MSB bits from flash ADC 56, and is a sum of currents through correspondingly switched current switches 72 which are controlled by the segments from 4-bit Flash ADC 56. $\overline{IDAC}$ 74b is the complement of IDAC as the sum of IDAC and $\overline{IDAC}$ equals the full scale current $I_{fs}$ of current DAC 66. Thus, $\overline{IDAC}$ is the sum of currents through current switches 72 that are not switched to produce IDAC.

As described earlier herein, equal $I_o$ currents are drawn from current switches 78a and b to provide the held $V_i$ at output 54 during the first or MSB phase of the two step conversion process. However, during the second or least significant bit (LSB) phase, switches 78a and b are switched in response to timing and control 52 to draw IDAC and $\overline{IDAC}$ currents 74a and b. In response thereto and in a manner to be described in detail later herein, VDAC is subtracted from the held $V_i$ thereby providing $V_{diff}$ at the output 54 of differential track & hold and subtractor 50. $V_{diff}$ is a differential voltage equal to the difference between $V_i$ and VDAC which is an analog voltage corresponding to the converted MSBs provided during the first phase. In this second phase of conversion, timing and control 52 causes switches 58a and b to couple $V_{diff}$ or the residue of $V_i$ less the VDAC of the MSBs through ×16 multiplier 80 to flash ADC 56. Those of skill in the art will recognize that if flash ADC 56 were other than a 4-bit converter, multiplier 80 would multiply by a different factor to scale the least significant bits up to the level of the most significant bits already subtracted from $V_i$. Flash ADC 56 converts the multiplied $V_{diff}$ to its digital output which is fed to encoder 62 to couple the least significant bits (LSBs) to conventional digital corrector 82 where the four LSBs are combined with the four MSBs from MSB latch 64 to produce an 8-bit digital output which is transferred and stored in output latch 84. Thus, in short, $V_i$ is fed to low resolution flash ADC 56 to provide a 4-bit conversion which is stored, and also is fed to current DAC 66 to provide currents IDAC and $\overline{IDAC}$ corresponding to the analog current conversion of the MSBs. The currents are used to provide $V_{diff}$ which is the difference between $V_i$ and VDAC, and $V_{diff}$ is multiplied by an appropriate factor and fed back to flash ADC 56. The flash ADC 56 output is now the four LSBs which are combined with the four MSBs to provide a higher resolution 8-bit analog-to-digital conversion.

Figure 3:
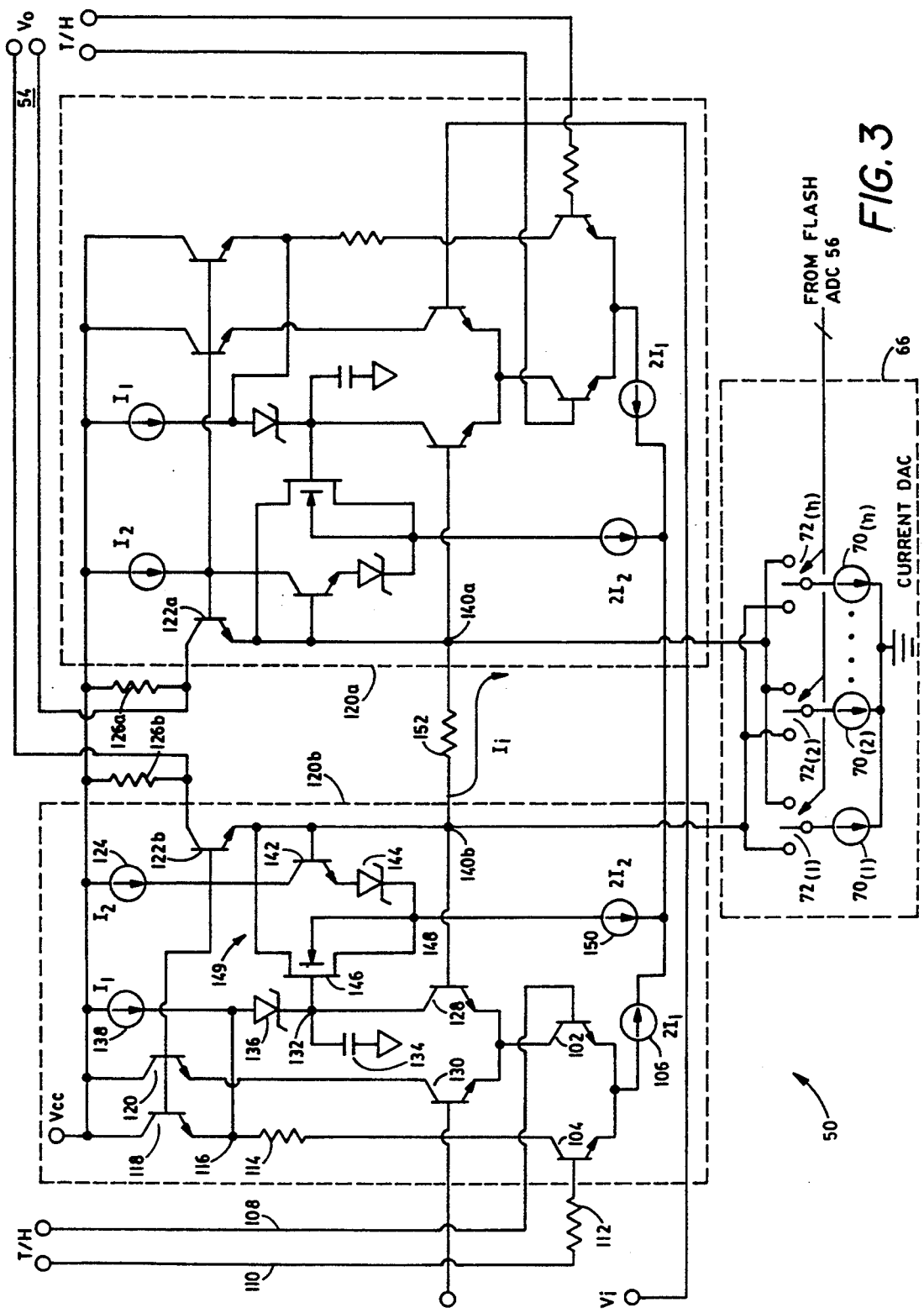
FIG. 3 is an simplified circuit implementation of the differential track & hold and subtractor of FIG. 2 with interconnections to a portion of the current DAC.

Referring to FIG. 3, differential track & hold and subtractor 50 has two sections 100a and b, each of which is responsive to a respective one of the two analog input signals of $V_i$. Sections 100a and b are identical and operate substantially the same, so only section 100b will be discussed in detail. Differential pair of transistors 102 and 104 have emitters tied in common through 2I$_1$ current source 106. The track and hold lines 108 and 110 from timing and control 52 are respectively connected to the base of transistor 102 and through resistor 112 to the base of transistor 104. The collector of transistor 104 is coupled through resistor 114 to node 116 which is connected to the emitter of transistor 118. The base of transistor 118 is connected in common with the bases of transistor 120 and output transistor 122b, and is also connected through I$_2$ current source 124 to $V_{cc}$. The collectors of transistors 118 and 120 are connected to $V_{cc}$, and the collector of transistor 122b is connected through output resistor 126b to $V_{cc}$.

The collector of transistor 102 is connected to the emitters of transistors 128 and 130. The base of transistor 130 is arranged to receive one of the differential analog input signals $V_i$, while its collector is coupled to the emitter of transistor 120. The collector of transistor 128 is connected to node 132 which is coupled through capacitor 134 to ground. Node 132 is also connected to the cathode of Schottky diode 136 whose anode is connected through I$_1$ current source 138 to $V_{cc}$. The base of transistor 128 is connected to a node 140b that is connected to the emitter of transistor 122b. The emitter of transistor 122b is also connected to the base of transistor 142 whose emitter is connected to the anode of Schottky diode 144. The cathode of Schottky diode 144 is connected to a node 148 that is connected to the source of FET transistor 146, while the drain is connected to the emitter of transistor 122b. The gate of FET transistor 146 is connected to node 132. Node 148 is connected to 2I$_2$ current source 150 as shown. Node 140b is connected to a corresponding node 140a of section 100a through resistor 152 having twice the resistance of resistors 126a and b. Node 140a is further connected to respective terminals of current switches 72$_{(1)}$ to 72$_{(n)}$, where n is the number of segments, here 15, from flash ADC 56. Node 140b is further connected to respective opposite terminals of current switches 72$_{(1)}$ to 72$_{(n)}$. The switched terminals of current switches 72$_{(1)}$ to 72$_{(n)}$ are connected to respective identical current sources 70$_{(1)}$ to 70$_{(n)}$. Current switches 72 and current sources 70 are part of current DAC 66.

In operation, timing and control 52 causes differential track & hold and subtractor 50 to operate in a track mode by putting a high signal on track line 108 and a complementary low signal on hold line 110. In response thereto, transistor 102 is turned on, and transistor 104 is turned off. Therefore, the 2I$_1$ current for current source 106 is drawn through transistor 102. The 2I$_1$ current flows from the combination of transistors 128 and 130. When the bases of transistors 128 and 130 are equal, equal currents flow through transistors 128 and 130. Therefore, under this condition, I$_1$ current is drawn through the collector of transistor 128, and also is supplied through Schottky diode 136 by I$_1$ current source 138. Thus, under the condition when the voltage at node 140b is the same as the respective input voltage $V_i$ signal, the charge on capacitor 134 remains the same. The combination of transistor 142, Schottky diode 144 and FET transistor 146 functions as a unity gain buffer amplifier 149 with high input impedance to drive node 140b to the voltage charge of capacitor 134.

If the respective input voltage $V_i$ signal on the base of transistor 130 is larger than the voltage of node 140b on the base of transistor 128, then more current flows through transistor 130 than transistor 128. As a result, less than I$_1$ current flows through transistor 128, and the excess current of I$_1$ current from current source 138 charges capacitor 134 to a higher voltage, and that voltage is presented to node 140b by unity gain amplifier 149. Conversely, if the voltage of node 140b is higher than the input voltage to the base of transistor 130, more than I$_1$ current flows through transistor 128, and capacitor 134 is therefore correspondingly discharged. In such manner, the differential voltage between respective nodes 140a and b tracks the differential input voltage $V_i$.

Timing and control 52 causes differential track & hold and subtractor 50 to switch to the hold mode by reversing the signals on track and hold lines 108 and 110. More specifically, a high signal is applied to the base of transistor 104 turning it on, and a low signal is applied to the base of transistor 102 turning it off. The 2I$_1$ current for current source 106 now flows through transistor 104; I$_1$ flows from current source 138 to node 116, and I$_1$ flows from transistor 118 to node 116. The diversion of I$_1$ current from current source 138 causes Schottky diode 136 to turn off thereby operating with the turning off of transistor 128 to isolate node 132 and capacitor 134 from any charging or discharging current. With FET transistor 146 being a high input impedance device, the charge on capacitor 134 is held, and also buffer amplifier 149 continues to drive node 140b to the held voltage $V_i$.

Differential track & hold and subtractor 50 exhibits a low settling time, high speed, and occupies a relatively small die space. For example, rather than using standard architecture with multistage amplifiers and diode bridges to switch the hold capacitor 134, a single Schottky diode 136 is used here. Further, the voltage $V_{d136}$ across Schottky diode 136 is defined by the following equation:

$$V_{d136} = V_{be122b} + V_{be142} + V_{d144} - V_{gs146} - V_{be118} \qquad (1)$$

where $V_{be122}$, $V_{be142}$, and $V_{be118}$ are the base to emitter voltages of transistors 122, 142 and 118, respectively, $V_{d144}$ is the voltage across diode 144, and $V_{gs146}$ is the gate to substrate voltage of FET transistor 146. This $V_{d136}$ voltage does not depend on the level of input voltage $V_i$. Further, since $V_{be142}$ plus $V_{d144}$ is approximately equal to $V_{gs146}$, the leakage current through Schottky diode 136 is extremely low and independent of the voltage across hold capacitor 134. Resistors 112 and 114 are used to adjust the hold transients in order to minimize the hold pedestal.

Thus, in the track mode, the voltage between nodes 140a and b tracks $V_i$. In the hold mode, $V_i$ is held between nodes 140a and b, and across resistor 152 in a manner described heretofore. Therefore, the input current $I_i$ is $V_i/R_{152}$, and the resistance of $R_{152}$ is twice the resistance of resistors $R_{126b}$ and $R_{126a}$.

The differential output 54 of differential track & hold and subtractor 50 is taken from the respective collectors of transistors 122a and b of sections 100a and b, as shown. In the first or MSB phase, timing and control 52 controls current switches $72_{(1)}$ to $72_{(n)}$ to connect an equal number of elementary output current sources $70_{(1)}$ to $70_{(n)}$ to provide convenient bias currents of equal magnitude for transistors 122a and b. For example, with 15 segments as shown, seven current sources $70_{(1)}$ to $70_{(7)}$ could be connected through respective current switches $72_{(1)}$ to $72_{(7)}$ to node 140b to provide $I_o$, and seven current sources $70_{(8)}$ to $70_{(14)}$ could be connected through respective current switches $72_{(8)}$ to $72_{(14)}$ to node 140a to provide an equal $I_o$. Under such condition, $$V_o = (I_o + I_i)R_{126b} - (I_o - I_i)R_{126a}. \quad (2)$$

Because the two $I_o$ currents are equal and resistors $R_{126b}$ and $R_{126a}$ are equal, $$V_o = 2I_iR_{126b}. \quad (3)$$

Because $$2R_{126b} = R_{152}, \quad (4)$$

$$V_o = V_i. \quad (5)$$

That is, the differential output voltage $V_o$ at output 54 is the input voltage $V_i$ held across resistor 152 when current sources $70_{(1)}$ to $70_{(n)}$ connected to nodes 140a and b are equal.

In the second or LSB phase, current switches 72 are controlled by segments from flash ADC 56 to connect IDAC to node 140a and $\overline{IDAC}$ to node 140b. Therefore, $$V_o = (\overline{IDAC} + I_i)R_{126b} - (IDAC - I_i)R_{126a} \quad (6)$$

Simplifying, $$V_o = V_i - (IDAC - \overline{IDAC})R_{126b} \quad (7)$$

Flash ADC 56 has a full scale voltage $V_{fs}$, and the input voltage domain is between $-V_{fs}/2$ and $+V_{fs}/2$. Resistor $R_{126a}$ is equal to resistor $R_{126b}$, and $R_{126b}$ has a value such that $$V_{fs} = ID_{fs} \times R_{126b} \quad (8)$$

Thus, VDAC is defined as follows:

$$VDAC = (IDAC - \overline{IDAC})R_{126b} \quad (9)$$

and substituting equation 9 into equation 7, $$V_o = V_i - VDAC. \quad (10)$$

Thus, the differential output 54 of differential track & hold and subtractor 50 in the LSB of fine phase of conversion is $V_i$ – VDAC, here defined as the difference voltage $V_{diff}$.

With such arrangement, the same current sources $70_{(1)}$ to $70_{(n)}$ and the same current switches $72_{(1)}$ to $72_{(n)}$ are used to provide equal $I_o$ currents for providing the held input voltage $V_i$ across output resistor 152 to the differential output 54 in the first or MSB phase of conversion, and to provide IDAC and $\overline{IDAC}$ for providing $V_{diff}$ to the differential output 54 in the second or LSB phase of conversion. Further, the output stages of sections 120a and b operate in response to the currents $I_o$ or IDAC and $\overline{IDAC}$ from current DAC 66 to subtract VDAC during the LSB phase while selectively deactivating the subtraction process during the MSB phase. Thus, a separate subtractor circuit is not used.

This concludes the Description of the Preferred Embodiment. A reading of it by one skilled in the art will bring to mind many alterations and modifications that do not depart from the spirit and scope of the invention. Therefore, it is intended that the scope of the invention will be limited only by the appended claims.

What is claimed is:

1. A subranging analog-to-digital converter comprising:

a flash analog-to-digital converter;

differential track and hold means having first and second like sections each responsive to a respective input of a differential analog input voltage, and each section having an output terminal coupled through like first resistors to a voltage source;

a second resistor connected between respective nodes of said first and second sections;

said differential track and hold means comprising means responsive to control signals for causing a voltage between said nodes to track said differential analog input voltage during a track mode and for causing said voltage between said nodes to be held during a hold mode wherein, in said hold mode, the differential analog input voltage is applied across said second resistor;

current source means for drawing like currents from said nodes of said track and hold means during a first conversion phase to provide said differential analog input voltage held between said nodes across said output terminals;

means for coupling said differential analog input voltage from said output terminals to said flash analog-to-digital converter during said first phase to provide most significant bits of said held differential analog input voltage;

said current source means comprising means for drawing respective currents from said nodes of said track and hold means in accordance with outputs from said flash analog-to-digital converter during a second phase to provide a difference voltage across said output terminals wherein said difference voltage is the difference between said held differential analog input voltage and an analog conversion corresponding to said most significant bits;

means for multiplying said difference voltage and coupling the multiplied difference voltage to said flash analog-to-digital converter to provide least significant bits of said held differential analog input voltage; and means for combining said most and least significant bits.

2. The subranging analog-to-digital converter recited in claim 1 wherein each section of said track and hold means comprises an output transistor coupled between the respective node and the respective output terminal of said section.

3. The subranging analog-to-digital converter recited in claim 2 wherein the respective collector of each of said output transistors is connected to the respective output terminal.

4. The subranging analog-to-digital converter recited in claim 2 wherein the respective emitter of each of said output transistors is connected to the respective node.

5. The subranging analog-to-digital converter recited in claim 1 wherein each of said first resistors has a resistance half the resistance of said second resistor.

6. A subranging analog-to-digital converter comprising:
   a flash analog-to-digital converter for converting analog signals to digital signals;
   differential track and hold means for tracking a differential analog input voltage at output terminals in a tracking mode and for holding the differential voltage at said output terminals in a holding mode, the differential track and hold means comprising a pair of output transistors having first corresponding electrodes coupled to respective ones of said output terminals and second corresponding electrodes coupled to respective nodes on opposite sides of a first resistor;
   means for coupling a first differential output voltage of said track and hold means in a hold mode to said flash analog-to-digital converter during a first conversion phase to provide most significant bits of said first differential output voltage at the output of said flash analog-to-digital converter;
   digital-to-analog converter means responsive to output signals from said flash analog-to-digital converter means for providing IDAC and $\overline{\text{IDAC}}$ currents where the sum of IDAC and $\overline{\text{IDAC}}$ equals a full scale current of the digital-to-analog converter means, said IDAC and $\overline{\text{IDAC}}$ currents being drawn from respective ones of said nodes of said track and hold means to provide a second differential voltage at said output terminals, said second differential voltage being equal to the difference between said first differential voltage and VDAC where VDAC corresponds to the analog voltage conversion of said most significant bits;
   means for multiplying said second differential voltage and for coupling said multiplied voltage to said flash analog-to-digital converter during a second conversion phase to provide least significant bits of said first differential output voltage; and
   means for combining said most and least significant bits.

7. The subranging analog-to-digital converter recited in claim 6 wherein said first corresponding electrodes of said output transistors of said track and hold means are collectors.

8. The subranging analog-to-digital converter recited in claim 7 further comprising respective second resistors coupled between said collectors and a voltage source.

9. The subranging analog-to-digital converter recited in claim 8 wherein each of said second resistors has a resistance half the resistance of said first resistor.

10. The subranging analog-to-digital converter recited in claim 6 wherein said IDAC and $\overline{\text{IDAC}}$ current providing means comprises a plurality of equal current sources.

11. The subranging analog-to-digital converter recited in claim 10 further comprising means for coupling an equal number of said current sources to each of said nodes of said track and hold means during said first phase to draw equal output currents from said nodes.

12. A method of converting a differential analog input voltage to a digital value, comprising the steps of:
   providing a control signal to hold the differential input voltage across a first resistor connected between respective nodes of two like sections of a track and hold circuit;
   drawing like currents from said two nodes to provide said held differential input voltage across respective output terminals of said two like sections;
   coupling the differential input voltage from the output terminals of the track and hold circuit to a flash analog-to-digital converter to provide most significant bits of said held differential input voltage;
   converting an output of said flash analog-to-digital converter to respective IDAC and $\overline{\text{IDAC}}$ currents wherein IDAC corresponds to the analog current conversion of the most significant bits, and $\overline{\text{IDAC}}$ is a complement of IDAC;
   drawing IDAC and $\overline{\text{IDAC}}$ from said two nodes during a second phase of conversion to provide at the output terminals a voltage equal to the difference between the differential input voltage and a voltage corresponding to the analog conversion of said most significant bits;
   multiplying said difference voltage and coupling said multiplied voltage to said flash analog-to-digital converter to provide the least significant bits of said differential input voltage; and
   combining said most and least significant bits to from said digital value.

* * * * *